US012794470B1

(12) United States Patent
Aurangabadkar et al.

(10) Patent No.: US 12,794,470 B1
(45) Date of Patent: Nov. 10, 2026

(54) HIGH SPEED CLOCK MULTIPLEXING CIRCUIT

(71) Applicant: Synopsys, Inc., Sunnyvale, CA (US)

(72) Inventors: Aditya Sunil Aurangabadkar, Pune (IN); Shourya Kansal, Bangalore (IN)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 19/219,288

(22) Filed: May 27, 2025

(51) Int. Cl.
*H03K 17/693* (2006.01)
*H03K 17/00* (2006.01)

(52) U.S. Cl.
CPC ......... *H03K 17/693* (2013.01); *H03K 17/005* (2013.01)

(58) Field of Classification Search
CPC ............................. H03K 17/05; H03K 17/693
See application file for complete search history.

(56) References Cited

U.S. PATENT DOCUMENTS

| | | | | |
|---|---|---|---|---|
| 10,727,836 B1 * | 7/2020 | Raghuraman | ...... | H03K 19/1737 |
| 2006/0170459 A1 * | 8/2006 | Shin | ..................... | H03K 17/693 326/113 |
| 2013/0113520 A1 * | 5/2013 | Chen | .................. | H03K 19/1737 326/58 |
| 2017/0276729 A1 * | 9/2017 | Kim | ............... | G01R 31/318541 |

* cited by examiner

*Primary Examiner* — Patrick O Neill
(74) *Attorney, Agent, or Firm* — Weaver Austin Villeneuve & Sampson LLP

(57) ABSTRACT

A clock multiplexing circuit includes first and second clock drivers respectively receiving first and second clocks. Each clock driver includes first and second tri-stateable inverters, and first and second circuit blocks. The first tri-stateable inverters either inverts a first signal, or is in a high-impedance state in response to the assertion or deassertion of an enabling signal. The second tri-stateable inverter either inverts a second signal, or is in a high-impedance state in response to the assertion or deassertion of the enabling signal. Each of the first and second signals is representative of a respective one of the first and second clocks. In response to the deassertion of the enabling signal, the first circuit block couples the input of the first tri-stateable inverter to a ground terminal, and the second circuit block couples an input of the second tri-stateable inverter to a supply voltage.

20 Claims, 8 Drawing Sheets

HIGH SPEED CLOCK MULTIPLEXING CIRCUIT

TECHNICAL FIELD

The present application relates to electronic circuits, and more particularly to a high speed clock multiplexing circuit.

BACKGROUND

The data rate of high-speed serial links has been increasing significantly over the past decades to hundreds of gigabits per second. High-speed serial links have become even more critical due to the acceleration in the use of artificial intelligence (AI) applications. High-speed serials links require clocking circuits that can operate at 10 GHz and above. The clock propagation should occur with a small amount of jitter and duty cycle error, both of which are strongly dependent on the clock slew.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to a clock multiplexing circuit that selects from among a multitude of clock signals and delivers the selected clock signal as an output clock signal. The selected clock signal has rising and falling transition times that are nearly equal to one another. The selected cock signal therefore has a substantially improved clock slew and duty cycle.

Figure 1A:
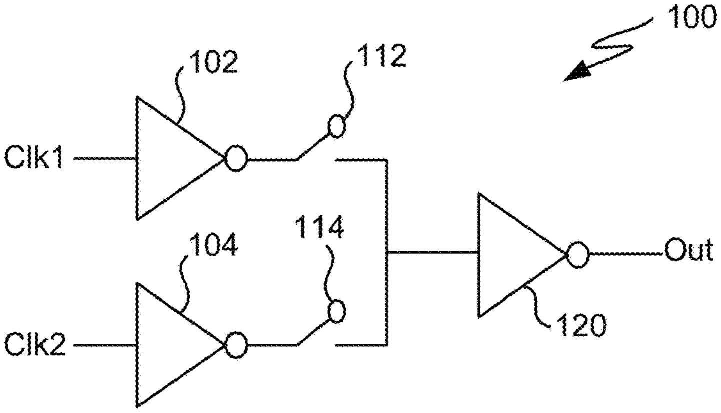
FIG. 1A is a gate-level schematic diagram of a clock multiplexing circuit.

FIG. 1A is a gate-level schematic diagram of a clock multiplexing circuit 100. Clock multiplexing circuit 100 is shown as including a first inverter 102 receiving clock signal Clk1, a second inverter 104 receiving clock signal Clk2, a first switch 112, a second switch 114, and a third inverter 120. When switch 112 is closed and switch 114 is open, output node Out of inverter 120 receives clock signal Clk1. Conversely, when switch 114 is closed and switch 112 is open, output node Out receives clock signal Clk2. As is described further below, clock multiplexing circuit 100 has a relatively high parasitic output capacitance.

Figure 1B:
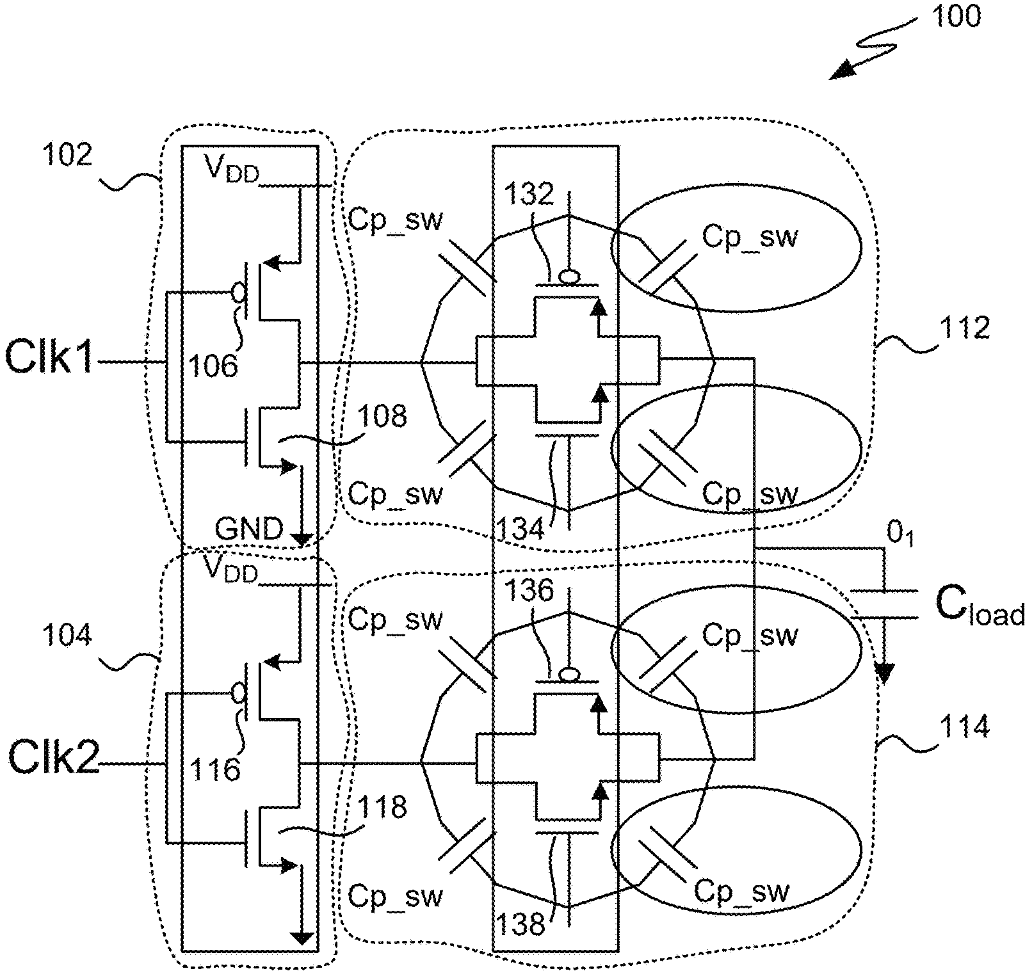
FIG. 1B is a transistor-level schematic diagram of a portion of the clock multiplexing circuit of FIG. 1.

FIG. 1B is a transistor-level schematic diagram of inverters 102, 104, and switches 112, 114 of clock multiplexing circuit 100. Inverter 102 is shown as including a p-type metal-oxide-semiconductor (PMOS) field-effect transistor 106, and an N-type metal-oxide-semiconductor (NMOS) field-effect transistor 108. Transistors 106 and 108 form the driver of clock signal Clk1. Inverter 104 is shown as including a PMOS transistor 116 and an NMOS transistor 118. Transistors 116 and 118 form the driver of clock signal Clk2.

Switch 112 is shown as including a PMOS pass-gate transistor (also referred to herein as transmission gate) 132, and an NMOS pass-gate transistor 134. Switch 114 is shown as including a PMOS pass-gate transistor 136, and an NMOS pass-gate transistor 138. Parasitic capacitances Cp_sw, shown in FIG. 1B, represent the gate-to-source and gate-to-drain parasitic capacitances of pass-gate transistors 132, 134, 136 and 138. Pass-gate transistors 132 and 134 are connected in parallel to accommodate the high voltage (e.g., supply voltage $V_{DD}$) and the low voltage (e.g., the ground voltage GND) associated with the clock signals Clk1 and Clk2. Pass-gate transistors 136 and 138 are also connected in parallel to accommodate the high and low voltages associated with clock signals Clk1 and Clk2.

Pass-gate transistors 132, 134, 136, 138 often have channel-width (W) to channel-length (L) ratios (i.e., W/L) that are larger than the W/L of transistors 106, 108, 116, 118, in order to have smaller on resistances. The relatively large (W/L) of transistors 132, 134, 136, 138 result in a relatively high parasitic capacitance at output node O1 of the pass-gate transistors. The sum of the parasitic capacitances at the output node O1 is 4×Cp_sw. The relatively high capacitance at the output node O1 increases the rise and fall times of the signal at node O1 due to the increased load. Accordingly, the on resistances of the pass-gate transistors disposed in clock multiplexing circuit 100 cannot be reduced without an attendant increase in the parasitic capacitance at output node O1 of the clock multiplexing circuit.

Figure 2:
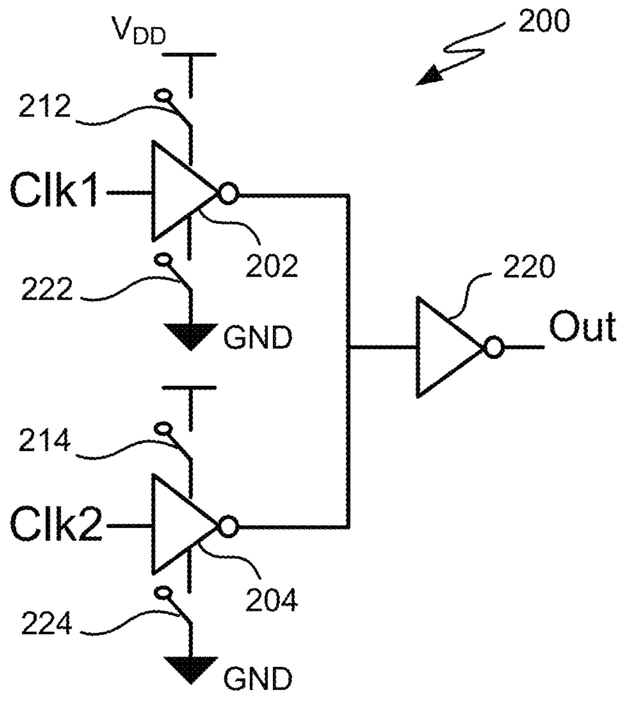
FIG. 2 is a gate-level schematic diagram of a clock multiplexing circuit.

FIG. 2 is a gate-level schematic diagram of a clock multiplexing circuit 200 adapted to select between a first clock signal Clk1 and a second clock signal Clk2. Clock multiplexing circuit 200 is shown as including, in part, a first tri-statable inverter 202 receiving clock signal Clk1, a second tri-statable inverter 204 receiving clock signal Clk2, switches 212 and 222 adapted to connect the transistors disposed in tri-statable inverter 202 to supply voltage $V_{DD}$ and ground respectively, and switches 214 and 224 adapted to connect the transistors disposed in tri-statable inverter 204 to supply voltage $V_{DD}$ and ground respectively. Inverter 220 is adapted to invert the clock signal supplied at the output terminals of tri-statable inverters 202, 204, and deliver the selected clock signal to output node Out of clock multiplexing circuit 200.

When switches 212 and 222 are closed and switches 214 and 224 are open, multiplexing circuit 200 selects clock signal Clk1 for delivery to output node Out.

Conversely, when switches 212 and 222 are open and switches 214 and 224 are closed, multiplexing circuit 200 selects clock signal Clk2 for delivery to output node Out. In clock multiplexing circuit 200, switches 212, 222, 214 and 224 may be selected to have relatively large W/L ratios to decrease their respective on resistances. However, clock multiplexing circuit 200 suffers from unequal rise and fall times of the output clock signal, which in turn leads to distortion of the duty cycle and skew of the output clock.

Figure 3:
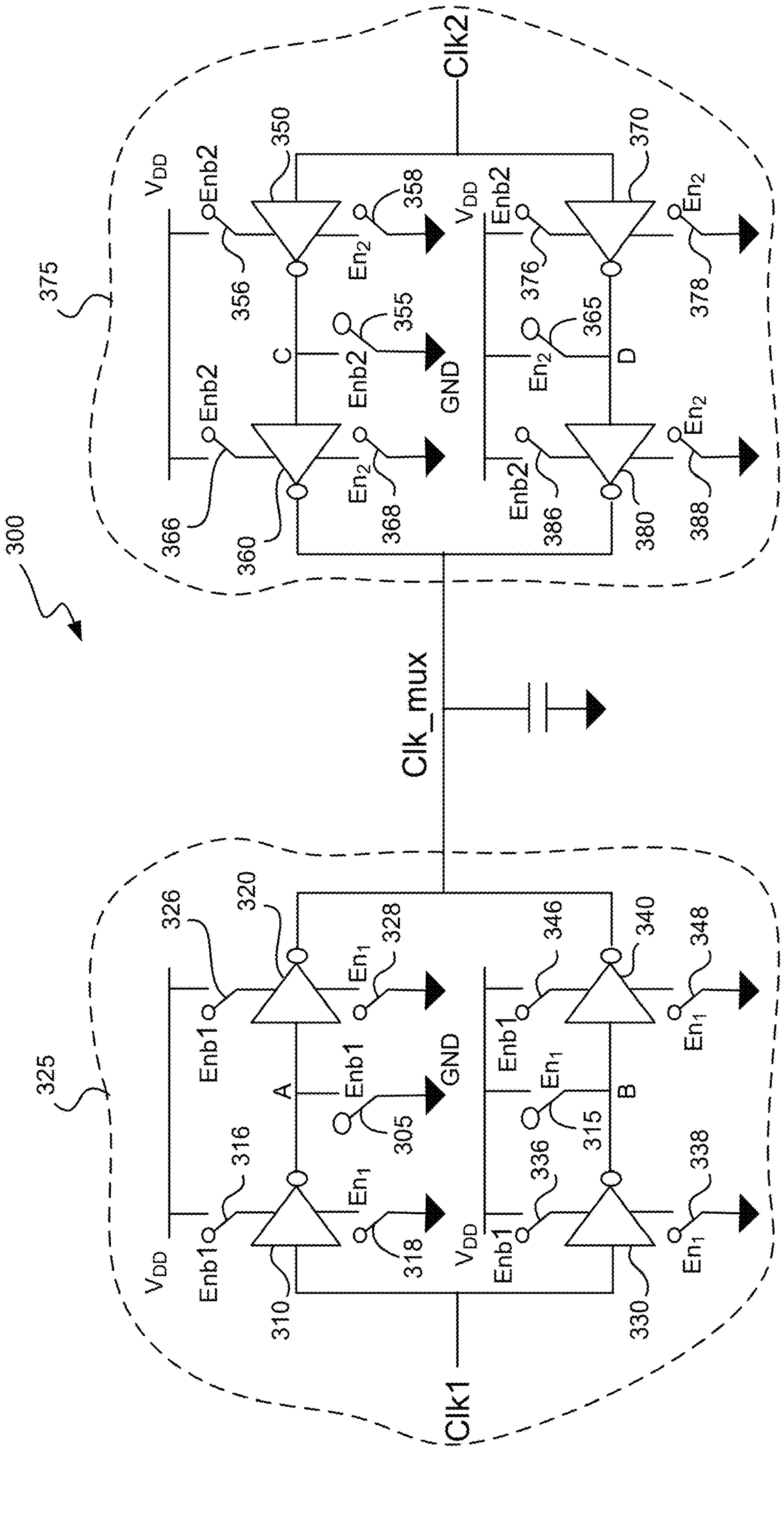
FIG. 3 is a gate-level schematic diagram of a clock multiplexing circuit, in accordance with one embodiment of the present disclosure.

FIG. 3 is a gate-level schematic diagram of a clock multiplexing circuit 300, in accordance with one embodiment of the present disclosure. Clock multiplexing circuit 300 is shown as multiplexing (selecting) between first clock signal Clk1 and second clock signal Clk2. It is understood that a clock multiplexing circuit, in accordance with embodiments of the present disclosure, may select between any number of clock signals.

Clock multiplexing circuit 300 is shown as including a clock driver 325 associated with clock signal Clk1, and clock driver 375 associated with clock signal Clk2. Clock driver 325 is shown as including, in part, tri-statable inverters 310, 320, 330, 340, and switches 316, 318, 326, 328, 336, 338, 346, 348, 305, 315. Clock driver 375 is shown as including, in part, tri-statable inverters 350, 360, 370, 380, and switches 356, 358, 366, 368, 376, 378, 386, 388, 355, 365. It is understood that switches 305, 315, 355 and 365 may be implemented using any circuit block.

Switches 318, 328, 338, 348, 315 receive the same enabling signal En1, and switches 316, 326, 336, 346, 305 receive the same enabling signal En1*b*—which is the inverse (complement) of signal En1. Accordingly, if, for example, signal En1 is at a logic 1 and signal En1*b* is at a logic 0, switches 316, 318, 326, 328, 336, 338, 346, 348 are closed, and switches 305, 315 are open, thereby causing tri-statable inverters 310, 320, 330, 340 to be active and invert the signals they receive. Conversely, if signal En1 is at a logic 0 and signal En1*b* is at a logic 1, switches 316, 318, 326, 328, 336, 338, 346, 348 are open, and switches 305, 315 are closed. Therefore, tri-statable inverters 310, 320, 330, 340 are placed in a high-impedance state; node A is pulled to the ground potential, and node B is raised to the supply voltage $V_{DD}$.

Switches 358, 368, 378, 388, 365 receive the same enabling signal En2, and switches 356, 366, 376, 386, 355 receive the same enabling signal Enb2—which is the inverse of signal En2. Accordingly, if, for example, signal En2 is at a logic 1 and signal Enb2 is at a logic 0, switches 356, 358, 366, 368, 376, 378, 386, 388 are closed, and switches 355, 365 are open, thereby causing tri-statable inverters 350, 360, 370 and 380 to be active and invert the signals they receive. Conversely, if signal En2 is at a logic 0 and signal Enb2 is at a logic 1, switches 356, 358, 366, 368, 376, 378, 386, 388 are open, and switches 355, 365 are closed. Accordingly, tri-statable inverters 350, 360, 370, 380 are place in a high-impedance state; node C is pulled to the ground potential, and node D is raised to the supply voltage $V_{DD}$.

Therefore, for the example shown in FIG. 3, to select clock Clk1, signals En1/Enb1 are set to logic 1/0 respectively, and signals En2/Enb2 are set to logic 0/1 respectively. Similarly, to select clock Clk2, signals En1/Enb1 are set to logic 0/1 respectively, and signals En2/Enb2 are set to logic 1/0 respectively.

Figure 4:
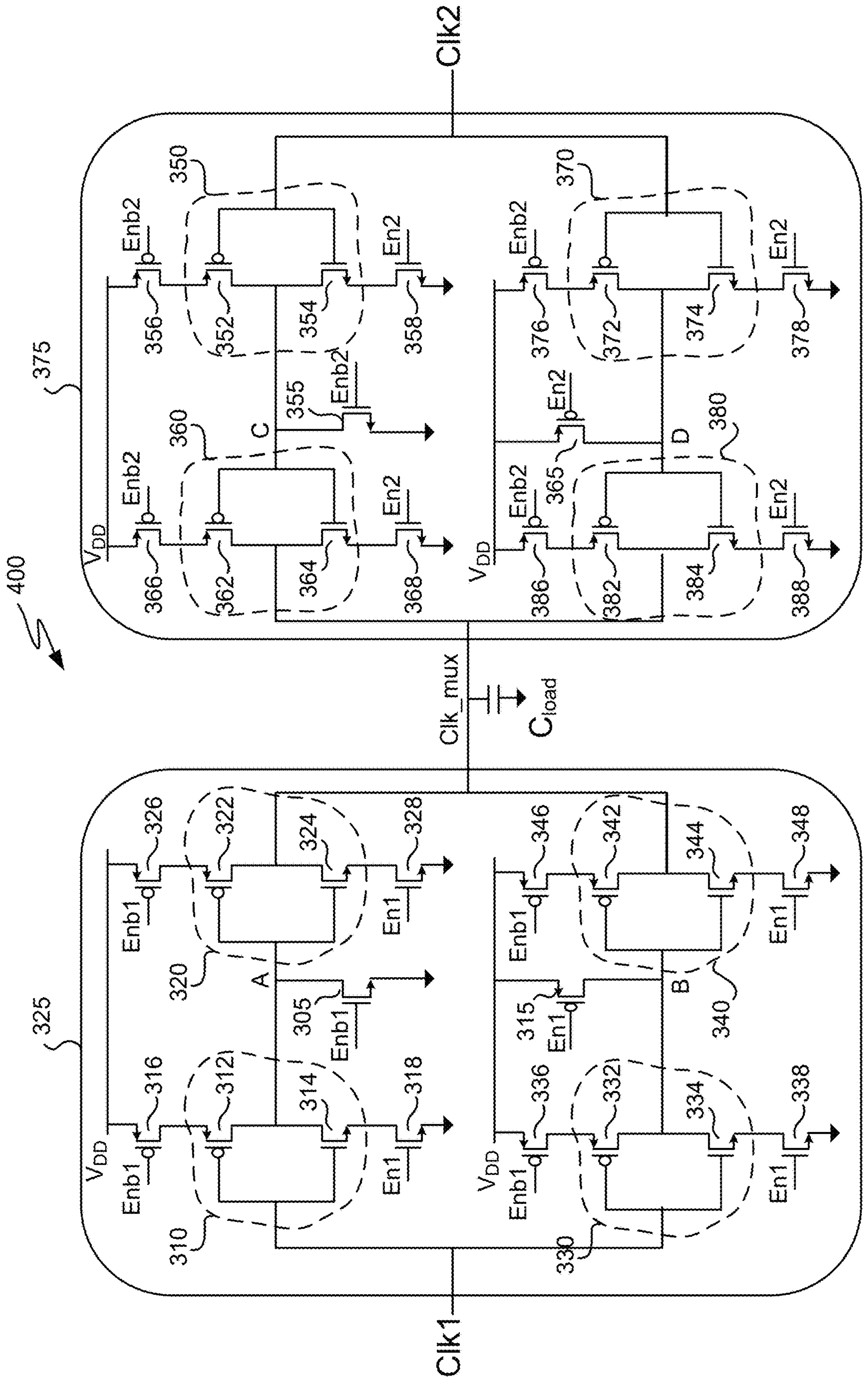
FIG. 4 is a transistor-level schematic diagram of the clock multiplexing circuit shown in FIG. 3, in accordance with one embodiment of the present disclosure.

FIG. 4 is a transistor-level schematic diagram of clock multiplexing circuit 300 shown in FIG. 3, in accordance with one embodiment of the present disclosure. In FIG. 4, switches 316, 326, 336, 346, 315 are respectively shown as PMOS transistors 316, 326, 336, 346, 315; switches 318, 328, 338, 348, 305 are respectively shown as NMOS transistors 318, 328, 338, 348, 305; switches 356, 366, 376, 386, 365 are respectively shown as PMOS transistors 356, 366, 376, 386, 365; and switches 358, 368, 378, 388, 355 are respectively shown as NMOS transistors 358, 368, 378, 388, 355.

PMOS transistor 312 together with NMOS transistor 314 form a tri-stateable inverter that (i) inverts clock signal Clk1 when PMOS transistor 316 and NMOS transistor 318 are on, and (ii) is placed in a high-impedance state when PMOS transistor 316 and NMOS transistor 318 are off. In a similar manner, PMOS transistor 322 and NMOS transistors 324 form a tri-stateable inverter 320 that (i) inverts the signal at node A when PMOS transistor 326 and NMOS transistor 328 are on, and (ii) is placed in a high-impedance state when PMOS transistor 326 and NMOS transistor 328 are off; PMOS transistors 332 and NMOS transistors 334 form a tri-stateable inverter 330 that (i) inverts clock signal Clk1 when PMOS transistor 336 and NMOS transistor 338 are on, and (ii) is placed in a high-impedance state when PMOS transistor 336 and NMOS transistor 338 are off; PMOS transistors 342 and NMOS transistors 344 form a tri-stateable inverter 340 that (i) inverts the signal at node A when PMOS transistor 346 and NMOS transistor 348 are on, and (ii) is placed in a high-impedance state when PMOS transistor 346 and NMOS transistor 348 are off; PMOS transistor 352 and NMOS transistor 354 form a tri-stateable inverter 350 that (i) inverts clock signal Clk2 when PMOS transistor 356 and NMOS transistor 358 are on, and (ii) is placed in a high-impedance state when PMOS transistor 356 and NMOS transistor 358 are off; PMOS transistor 362 and NMOS transistor 364 form a tri-stateable inverter a 360 that (i) inverts the signal at node C when PMOS transistor 366 and NMOS transistor 368 are on, and (ii) is placed in a high-impedance state when PMOS transistor 366 and NMOS transistor 368 are off; PMOS transistor 372 and NMOS transistor 374 form a tri-stateable inverter 370 that (i) inverts clock signal Clk2 when PMOS transistor 376 and NMOS transistor 378 are on, and (ii) is placed in a high-impedance state when PMOS transistor 376 and NMOS transistor 378 are off; and PMOS transistor 382 and NMOS transistor 384 form a tri-stateable inverter 380 that (i) inverts the signal at node D when PMOS transistor 386 and NMOS transistor 388 are on, and (ii) is placed in a high-impedance state when PMOS transistor 386 and NMOS transistor 388 are off.

To select clock signal Clk1, signal En1 of clock driver 325 is asserted (i.e., set to a logic 1 in this example), and signal En2 of clock driver 355 is deasserted (i.e., set to a logic 0 in this example). When signal En1 is at a logic 1, signal Enb1 is at a logic 0, thereby causing transistors 316, 318, 326, 328, 336, 338, 346, 348 to be on. Accordingly, inverters 310, 320, 330 and 340 are active and invert the signals they receive, which in turn causes output node Clk_mux to receive clock signal Clk1. When signal En1 is at a logic 1 and signal Enb1 is at a logic 0, both transistors 305 and 315 are off. Moreover, when clock Clk1 is selected for delivery to output node Clk_mux, tri-statable inverters 350, 360, 370 and 380 of clock driver 375 are in a high impedance state, and transistors 365 and 355 are on, thereby causing node C to be pulled to the ground potential, and node D to be raised to supply voltage $V_{DD}$.

To select clock Clk2, signal En1 is deasserted and signal En2 is asserted. When signal En2 is at a logic 1, signal Enb2 is at a logic 0, thereby causing transistors 356, 358, 366, 368, 376, 378, 386, 388 to be on. Accordingly, inverters 350, 360, 370 and 380 are active and invert the signals they receive, thus causing output node Clk_mux to receive clock signal Clk2. When signal En2 is at a logic 1 and signal Enb2 is at a logic 0, both transistors 355 and 365 are off. When clock Clk2 is selected for delivery to output node Clk_mux, tri-statable inverters 310, 320, 330 and 340 of clock driver 325 are in a high impedance state, and transistors 305 and 315 are on, thereby causing node A to be pulled to the ground potential, and node B to be raised to supply voltage $V_{DD}$.

Tri-statable inverter (alternatively referred to herein as inverter for simplicity) 310 together with inverter 320 form a first buffer of clock driver 325, and inverters 330 and 340 together form a second buffer of clock driver 325. Similarly, inverters 350 and 360 form a first buffer of clock driver 375, and inverters 370 and 380 form a second buffer of clock driver 375. As was described above, one of the buffers in each clock driver includes a pull-down NMOS transistor switch at the input node of the output stage inverter of that buffer. For example, clock driver 325 includes a pull-down NMOS transistor switch 305 having a drain terminal coupled to node A which is an input to clock driver 325's output stage inverter 320. Similarly, clock driver 375 includes a pull-down NMOS transistor switch 355 having a drain terminal coupled to node C which is an input to clock driver 375's output stage inverter 360.

Similarly, one of the buffers in each clock driver includes a pull-up PMOS transistor switch at the input node of the output stage inverter of that buffer. For example, clock driver 325 includes a pull-up PMOS transistor switch 315 having a drain terminal coupled to node B which is an input to clock driver 325's output stage inverter 340. Similarly, clock driver 375 includes a pull-up PMOS transistor switch 365 having a drain terminal coupled to node D which is an input to clock driver 375's output stage inverter 380.

As was described above, to pass (select) signal Clk1 to output node Clk_mux, clock driver 325 is enabled and clock driver 375 is disabled. Similarly, to pass signal Clk2 to output node Clk_mux, clock driver 325 is disabled and clock driver 375 is enabled. Clock driver 325 is (i) enabled by setting signal En1 to logic 1 and signal Enb1 to logic 0, and (ii) disabled by setting signal En1 to logic 0 and signal Enb1 to logic 1. Similarly, clock driver 375 is (i) enabled by setting signal En2 to logic 1 and signal Enb2 to logic 0, and (ii) disabled by setting signal En2 to logic 0 and signal Enb2 to logic 1. Enabling clock driver 325 ensures (i) clock signal Clk1 is the source of (i.e., is the driver) the clock at output node Clk_mux, and (ii) clock driver 375 is in high impedance state. Similarly, enabling clock driver 375 ensures (i) clock signal Clk2 is the source of the clock at output node Clk_mux, and (ii) clock driver 325 is in high impedance state.

Consider the condition when clock driver 325 is enabled and clock driver 375 is disabled. When clock driver 325 is enabled, inverters 320 and 340 operate in parallel to deliver clock signal Clk1 to output node Clk_mux. The capacitive load at output node Clk_mux is shown as Cload. In addition to driving Cload, clock driver 325 drives the parasitic capacitance associated with the disabled state (also referred to herein as off state) of clock driver 375.

When clock driver 375 is disabled, the input of inverter 360 at node C is pulled to the ground potential, which depending on the voltage at output node Clk_mux, may turn on transistor 362. If transistor 362 turns on, the parasitic capacitance Cpar_p (not shown), which is the sum of the gate-to-drain capacitance and drain-to-source capacitance of transistor 366 as well as all the routing capacitance, will be visible at the output node Clk_mux. Transistor 366 is a power switch and has a relatively larger (W/L). In a similar manner, when node D is raised to supply voltage $V_{DD}$, depending on the voltage at output node Clk_mux, transistor 384 may turn on, thereby making the parasitic capacitance Cpar_n (not shown), which is the sum of the gate-to-drain capacitance and drain-to-source capacitance of transistor 388 as well as all the routing capacitance, visible at output node Clk_mux. In general, the parasitic capacitances Cpar_p and Cpar_n match because both power switch transistors, such as transistors 366 and 388, have the same (W/L) in order to provide the same pull-up and pull-down strength.

During the initial rising transition of the signal at output node Clk_mux when the voltage starts from 0, transistor 384 is on thereby rendering the capacitive Cpar_n visible at the output node Clk_mux. Therefore, during the initial part of the rising transition of the signal at output node Clk_mux, the total capacitance seen at node Clk_mux is defined by Cload+Cpar_n. As the voltage at node Clk_mux begins to rise further, transistor 384 starts to become less conductive as the gate-to-source voltage of transistor 384 starts to decrease. When the voltage at node Clk_mux begins to reach near the mid-point of the supply voltage, i.e., at $V_{DD}/2$ (it nearly equals to the threshold voltage VT or $V_{DD}$−VT), NMOS transistor 384 is almost off. At about the same time, PMOS transistor 362 begins to turn on due to the higher voltage of $V_{DD}/2$ at node Clk_mux. PMOS transistor 362 then stays on for nearly the entire second half of the rising transition at node Clk_mux as the gate-to-source voltage of transistor 362 continues to increase. Therefore, the total capacitive load at node Clk_mux during the second half of the rising transition is defined by Cload+Cpar_p.

Consequently, as the voltage at Clk_mux transitions from zero to $V_{DD}/2$, the total capacitance seen at node Clk_mux is Cload+Cpar_n. As the voltage at Clk_mux transitions from $V_{DD}/2$ to $V_{DD}$, the total capacitance seen at node Clk_mux is Cload+Cpar_p. However, as was described in detail above, parasitic capacitances Cpar_p and Cpar_n are substantially equal. Therefore, clock driver 325 sees the same amount of capacitance throughout the rising transition at node Clk_mux.

For similar reasons, the same amount of capacitance is seen by clock driver 325 during the entirety of a falling transition of the signal at node Clk_mux. In particular, during the first half of such a falling transition from $V_{DD}$ to $V_{DD}/2$, transistor 362 is on thus causing a total capacitance of Cload+Cpar_p to be seen at output node Clk_mux. During the second half of such a falling transition from $V_{DD}/2$ to 0, transistor 384 is on thus causing a total capacitance of Cload+Cpar_n to be seen at output node Clk_mux. Therefore, the same amount of capacitance is seen by clock driver 325 during the entire falling transition of the signal at node Clk_mux. Accordingly, the total capacitance seen by clock driver 325 during the entirety of rise and fall transitions at node Clk_mux are matched, thus resulting in a substantially similar rise time and fall time of the signal at node Clk_mux. Therefore, in accordance with embodiments of the present disclosure, the load seen by the clock drivers remain matched throughout the signal rise and fall transitions at node Clk_mux which receives the selected clock.

Figure 5:
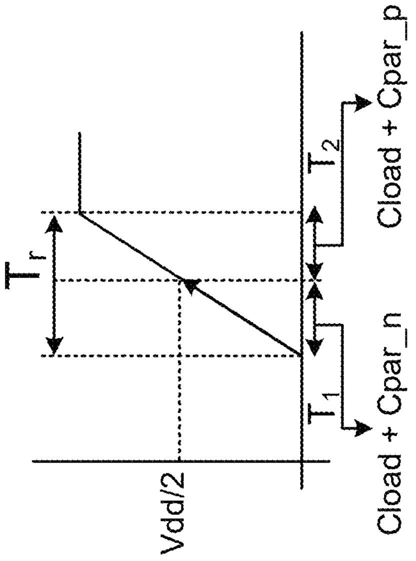
FIG. 5 shows an example of a rising transition of the signal at the output node of the clock multiplexing circuits of FIG. 4.

FIG. 5 shows a rising transition of a signal at output node Clk_mux. During the time period $T_1$ when the signal at output node Clk_mux is rising from zero to $V_{DD}/2$, the capacitance seen by the selected clock driver is Cload+Cpar_n. During the second time period $T_2$ when the signal at output node Clk_mux is rising from $V_{DD}/2$ to $V_{DD}$, the capacitance seen by the selected clock driver is Cload+Cpar_P. Because Cpar_n and Cpar_p have substantially the same value, the selected clock driver sees substantially the same capacitance during the entirety of the rising transition Tr.

Figure 6:
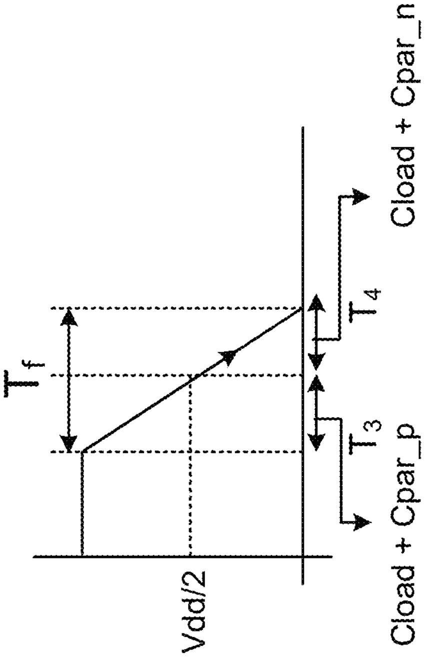
FIG. 6 shows an example of a falling transition of the signal at the output node of the clock multiplexing circuits of FIG. 4.

FIG. 6 shows a falling transition of a signal at output node Clk_mux. During the time period $T_3$ when the signal at output node Clk_mux is falling from $V_{DD}$ to $V_{DD}/2$, the capacitance seen by the selected clock driver is Cload+Cpar_p. During the second time period $T_4$ when the signal at output node Clk_mux is falling from $V_{DD}/2$ to zero, the capacitance seen by the clock driver is Cload+Cpar_n. Because Cpar_n and Cpar_p have substantially the same value, the selected clock driver sees substantially the same capacitance during the entirety of the falling transition $T_f$.

Figure 7:
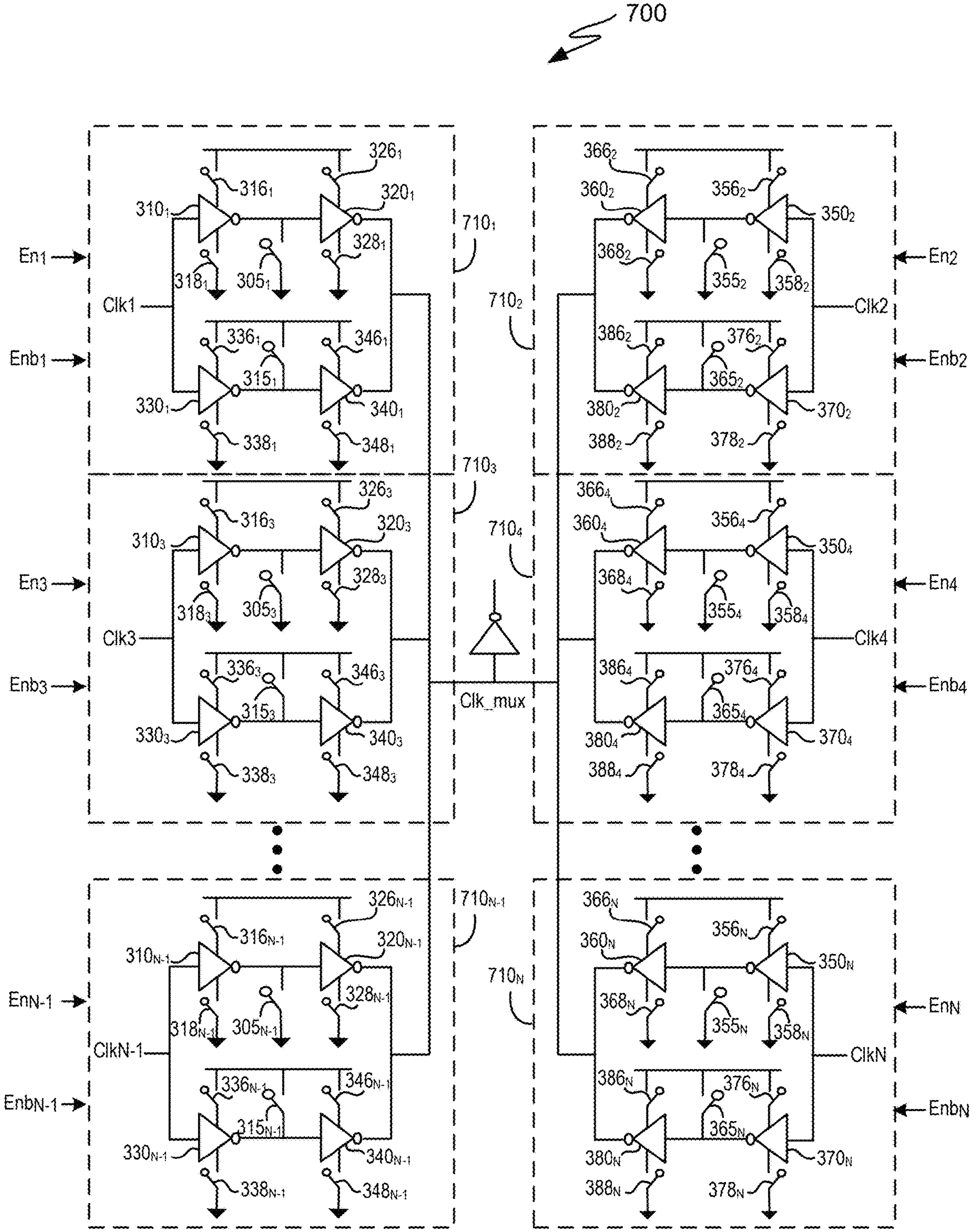
FIG. 7 is a gate-level schematic diagram of a clock multiplexing circuit, in accordance with another embodiment of the present disclosure.

A clock multiplexing circuit, in accordance with embodiments of the present disclosure may have any number of clock drivers. FIG. 7 shows a clock multiplexing circuit 700 that includes N clock drivers, namely $\mathbf{710}_1$, $\mathbf{710}_2$, $\mathbf{710}_3$ . . . $\mathbf{710}_{N-1}$, $\mathbf{710}_N$, where N is an integer greater than or equal to 2. Each clock driver receives a clock signal and a pair of complementary enabling signals. For example, clock driver $\mathbf{710}_1$ is shown as receiving clock signal Clk1 and a pair of complementary enabling signals $En_1$ and $Enb_1$; similarly clock driver $\mathbf{710}_N$ is shown as receiving clock signal $Clk_N$ and a pair of complementary enabling signals $En_N$ and $Enb_N$.

To select and deliver a clock from amongst clocks $Clk_i$ (i is an index ranging from 1 to N in this example) to output node Clk_mux, the enabling signal $En_i$ received by the clock driver is set to logic 1, and the complement of the enabling signal, namely $Enb_i$, received by the clock driver is set to logic 0. For example, to select and deliver Clk1 to output node Clk_mux, signals $En_1$ and $Enb_1$ are set to logic 1 and 0 respectively, while the remaining enabling signals $En_{i+1}$ and $Enb_{i+1}$ are set to logic 0 and logic 1 respectively. Similarly, to select and deliver $Clk_N$ to output node Clk_mux, signals $En_N$ and $Enb_N$ are set to logic 1 and 0 respectively, while the remaining enabling signals $En_j$ and $Enb_j$ are set to logic 0 and logic 1 respectively, where j is an index ranging from 1 to N−1 in this example.

Each clock driver $\mathbf{710}_i$ includes a pair of buffers, each of which is shown as having a chain of two inverters. For example, clock driver $\mathbf{710}_1$ has a first buffer formed by inverters $\mathbf{310}_1$ and $\mathbf{320}_1$, and a second buffer formed by inverters $\mathbf{330}_1$ and $\mathbf{340}_1$. Each clock driver $\mathbf{710}_i$ is further shown as having a pull-down switch at the input of the last inverter stage of one of the buffers, and a pull-up switch at the input of the last inverter stage of the other one of the buffers. For example, clock driver $\mathbf{710}_1$ is shown as having a pull-down switch 3051 at the input of inverter $\mathbf{320}_1$, and a pull-up switch $\mathbf{315}_1$ at the input of inverter $\mathbf{340}_1$. In one example, each pull-down switch is an NMOS transistor, and each pull-up switch is a PMOS transistor.

A clock multiplexing circuit, in accordance with one embodiment of the present disclosure, includes in part, at least a first clock driver receiving a first clock signal and a second clock driver receiving a second clock signal. Each of the first and second clock drivers includes, in part, a first tri-stateable inverter, a first circuit block, a second tri-stateable inverter, and a second circuit block. The first tri-stateable inverter is adapted to invert a first signal in response to an assertion of an enabling signal, and further adapted to be in a high-impedance state in response to a deassertion of the enabling signal. The first circuit block is adapted to couple an input of the first tri-stateable inverter to a ground terminal in response to the deassertion of the enabling signal. The second tri-stateable inverter is adapted to invert a second signal in response to the assertion of the enabling signal, and further adapted to be in the high-impedance state in response to the deassertion of the enabling signal. An output of the first tri-stateable inverter and an output of the second tri-stateable inverter are coupled to a first node. Each of the first and second signals is representative of a respective one of the first and second clock signals. The second circuit block is adapted to couple an input of the second tri-stateable inverter to a supply voltage in response to the deassertion of the enabling signal.

In one embodiment, each of the first and second tri-stateable inverters includes, in part, a first PMOS transistor having a source terminal coupled to the supply voltage and a gate terminal receiving an inverse of the enabling signal; a second PMOS transistor having a source terminal coupled to a drain terminal of the first PMOS transistor, and a gate terminal receiving a respective one of the first and second signals; a first NMOS transistor having a source terminal coupled to the ground terminal and a gate terminal receiving the enabling signal; and a second NMOS transistor having a source terminal coupled to a drain terminal of the first NMOS transistor, a gate terminal coupled to the gate terminal of the second PMOS transistor, and a drain terminal coupled to a drain terminal of the second PMOS transistor.

In one embodiment, each of the first and second clock drivers further includes, in part, a third tri-stateable inverter and a fourth tri-stateable inverter. The third tri-stateable inverter is adapted to invert the respective one of the first and second clock signals to generate the first signal in response to the assertion of the enabling signal, and is further adapted to be in the high-impedance state in response to the deassertion of the enabling signal. The fourth tri-stateable inverter is adapted to invert the respective one of the first and second clock signals to generate the second signal in response to the assertion of the enabling signal, and is further adapted to be in the high-impedance state in response to the deassertion of the enabling signal.

In one embodiment, each of the third and fourth tri-stateable inverters includes, in part, a third PMOS transistor having a source terminal coupled to the supply voltage and a gate terminal receiving the inverse of the enabling signal; a fourth PMOS transistor having a source terminal coupled to a drain terminal of the third PMOS transistor, and a gate terminal receiving the respective one of the first and second clock signals; a third NMOS transistor having a source terminal coupled to the ground terminal and a gate terminal receiving the enabling signal; and a fourth NMOS transistor having a source terminal coupled to a drain terminal of the third NMOS transistor, a gate terminal coupled to the gate terminal of the fourth PMOS transistor, and a drain terminal coupled to a drain terminal of the fourth PMOS transistor.

In one embodiment, the first circuit block is an NMOS transistor having a drain terminal receiving the first signal, a source terminal coupled to the ground terminal and a gate terminal receiving the inverse of the enabling signal. In one embodiment, the second circuit block is a PMOS transistor having a drain terminal receiving the second signal, a source terminal coupled to the supply voltage and a gate terminal receiving the enabling signal. In one embodiment, the ratio of a channel-width (W) to channel length (L) of the first PMOS transistor is greater than the W/L of the second PMOS transistor, and the W/L of the first NMOS transistor is greater than the W/L of the second NMOS transistor. In one embodiment, the clock multiplexing circuit delivers either the first clock signal or the second clock signal to the first node.

A method of multiplexing between a first clock signal and a second clock signal, in accordance with one embodiment of the present disclosure includes, in part, inverting a first signal in response to an assertion of an enabling signal by a first tri-stateable inverter; placing the first tri-stateable inverter in a high-impedance state in response to a deassertion of the enabling signal; inverting a second signal in response to the assertion of the enabling signal by a second tri-stateable inverter, wherein each of the first and second signals is representative of a respective one of the first and second clock signals; placing the second tri-stateable inverter in the high-impedance state in response to the deassertion of the enabling signal; coupling an output of the first tri-stateable inverter and the second tri-stateable inverter to a first node; coupling an input of the first tri-stateable inverter to a ground terminal in response to the deassertion of the enabling signal; and coupling an input of the second tri-stateable inverter to a supply voltage in response to the deassertion of the enabling signal.

In accordance with one embodiment of the method, each of the first and second tri-stateable inverters includes, in part, a first PMOS transistor having a source terminal coupled to the supply voltage and a gate terminal receiving an inverse of the enabling signal; a second PMOS transistor having a source terminal coupled to a drain terminal of the first PMOS transistor, and a gate terminal receiving a respective one of the first and second signals; a first NMOS transistor having a source terminal coupled to the ground terminal and a gate terminal receiving the enabling signal; and a second NMOS transistor having a source terminal coupled to a drain terminal of the first NMOS transistor, a gate terminal coupled to the gate terminal of the second PMOS transistor, and a drain terminal coupled to a drain terminal of the second PMOS transistor.

In one embodiment, the method further includes, in part, inverting the respective one of the first and second clock signals by a third tri-stateable inverter to generate the first signal in response to the assertion of the enabling signal; placing the third tri-stateable in the high-impedance state in response to the deassertion of the enabling signal; inverting the respective one of the first and second clock signals by a fourth tri-stateable inverter to generate the second signal in response to the assertion of the enabling signal; and placing the fourth tri-stateable inverter in the high-impedance state in response to the deassertion of the enabling signal.

In one embodiment of the method, each of the third and fourth tri-stateable inverters further includes, in part, a third PMOS transistor having a source terminal coupled to the supply voltage and a gate terminal receiving the inverse of the enabling signal; a fourth PMOS transistor having a source terminal coupled to a drain terminal of the third PMOS transistor, and a gate terminal receiving the respective one of the first and second clock signals; a third NMOS transistor having a source terminal coupled to the ground terminal and a gate terminal receiving the enabling signal; and a fourth NMOS transistor having a source terminal coupled to a drain terminal of the third NMOS transistor, a gate terminal coupled to the gate terminal of the fourth PMOS transistor, and a drain terminal coupled to a drain terminal of the fourth PMOS transistor.

In one embodiment, the method further includes, in part, coupling an input of the first tri-stateable inverter to a ground terminal by an NMOS transistor. In one embodiment, the method further includes, in part, coupling an input of the second tri-stateable inverter to a supply voltage by a PMOS transistor. In one embodiment of the method, a ratio of the channel-width (W) to channel length (L) of the first PMOS transistor is greater than the W/L of the second PMOS transistor, and the W/L of the first NMOS transistor is greater than the W/L of the second NMOS transistor. In one embodiment, the method further includes, in part, delivering either the first clock signal or the second clock signal to the first node.

A non-transitory computer readable medium includes, in part, stored instructions, which when executed by a processor, cause the processor to generate data representative of a clock multiplexing circuit. The clock multiplexing circuit includes, in part, at least a first clock driver receiving a first clock signal and a second clock driver receiving a second clock signal. Each of the first and second clock drivers includes, in part, a first tri-stateable inverter, a first circuit block, a second tri-stateable inverter, and a second circuit block. The first tri-stateable inverter is adapted to invert a first signal in response to an assertion of an enabling signal, and further adapted to be in a high-impedance state in response to a deassertion of the enabling signal. The first circuit block is adapted to couple an input of the first tri-stateable inverter to a ground terminal in response to the deassertion of the enabling signal. The second tri-stateable inverter is adapted to invert a second signal in response to the assertion of the enabling signal, and further adapted to be in the high-impedance state in response to the deassertion of the enabling signal. An output of the first tri-stateable inverter and an output of the second tri-stateable inverter are coupled to a first node. Each of the first and second signals is representative of a respective one of the first and second clock signals. The second circuit block is adapted to couple an input of the second tri-stateable inverter to a supply voltage in response to the deassertion of the enabling signal.

In one embodiment, each of the first and second tri-stateable inverters includes, in part, a first PMOS transistor having a source terminal coupled to the supply voltage and a gate terminal receiving an inverse of the enabling signal; a second PMOS transistor having a source terminal coupled to a drain terminal of the first PMOS transistor, and a gate terminal receiving the first signal; a first NMOS transistor having a source terminal coupled to the ground terminal and a gate terminal receiving the enabling signal; and a second NMOS transistor having a source terminal coupled to a drain terminal of the first NMOS transistor, a gate terminal receiving the first signal, and a drain terminal coupled to a drain terminal of the second PMOS transistor.

In one embodiment, each of the first and second clock drivers further includes, in part, a third tri-stateable inverter and a fourth tri-stateable inverter. The third tri-stateable inverter is adapted to invert the respective one of the first and second clock signals to generate the first signal in response to the assertion of the enabling signal, and is further adapted to be in the high-impedance state in response to the deassertion of the enabling signal. The fourth tri-stateable inverter is adapted to invert the respective one of the first and second clock signals to generate the second signal in response to the assertion of the enabling signal, and is further adapted to be in the high-impedance state in response to the deassertion of the enabling signal.

In one embodiment, each of the third and fourth tri-stateable inverters further includes, in part, a third PMOS transistor having a source terminal coupled to the supply voltage and a gate terminal receiving the inverse of the enabling signal; a fourth PMOS transistor having a source terminal coupled to a drain terminal of the third PMOS transistor, and a gate terminal receiving the respective one of the first and second clock signals; a third NMOS transistor having a source terminal coupled to the ground terminal and a gate terminal receiving the enabling signal; and a fourth NMOS transistor having a source terminal coupled to a drain terminal of the third NMOS transistor, a gate terminal coupled to the gate terminal of the fourth PMOS transistor, and a drain terminal coupled to a drain terminal of the fourth PMOS transistor.

Figure 8:
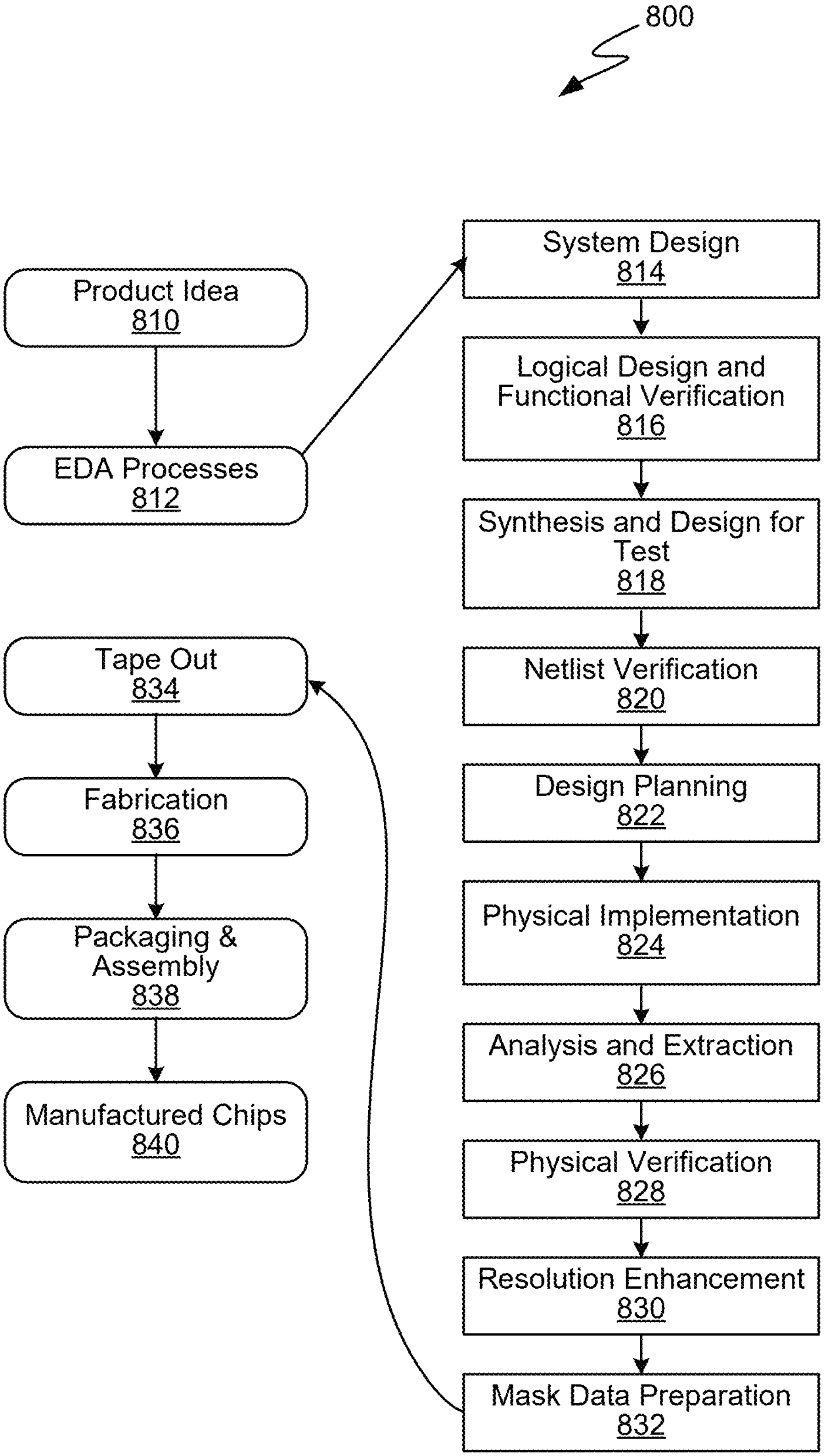
FIG. 8 is a flow diagram of various processes used during the design and manufacture of an integrated circuit in accordance with some embodiments of the present disclosure.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 836 are performed to produce the finished integrated circuit 840.

Specifications for a circuit or electronic structure may range from low-level transistor material layouts to high-level description languages. A high-level description may be used to design circuits and systems, using a hardware description language ('HDL') such as VHDL, Verilog, SystemVerilog, SystemC, MyHDL or Open Vera. The HDL description can be transformed to a logic-level register transfer level ('RTL') description, a gate-level description, a layout-level description, or a mask-level description. Each lower level description adds more useful detail into the design description, for example, more details for the modules that include the description. The lower levels of description can be generated by a computer, derived from a design library, or created by another design automation process. An example of a specification language at a lower level language for specifying more detailed descriptions is SPICE, which is used for detailed descriptions of circuits with many analog components. Descriptions at each level is enabled for use by the corresponding tools of that layer (e.g., a formal verification tool). A design process may use a sequence depicted in FIG. 8. The processes described may be enabled by EDA products (or tools).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 1400 of FIG. 14) may be used to store the programs and data structures that are used by some or all of the EDA products described herein, and products used for development of cells for the library and for physical and logical design that use the library.

Figure 9:
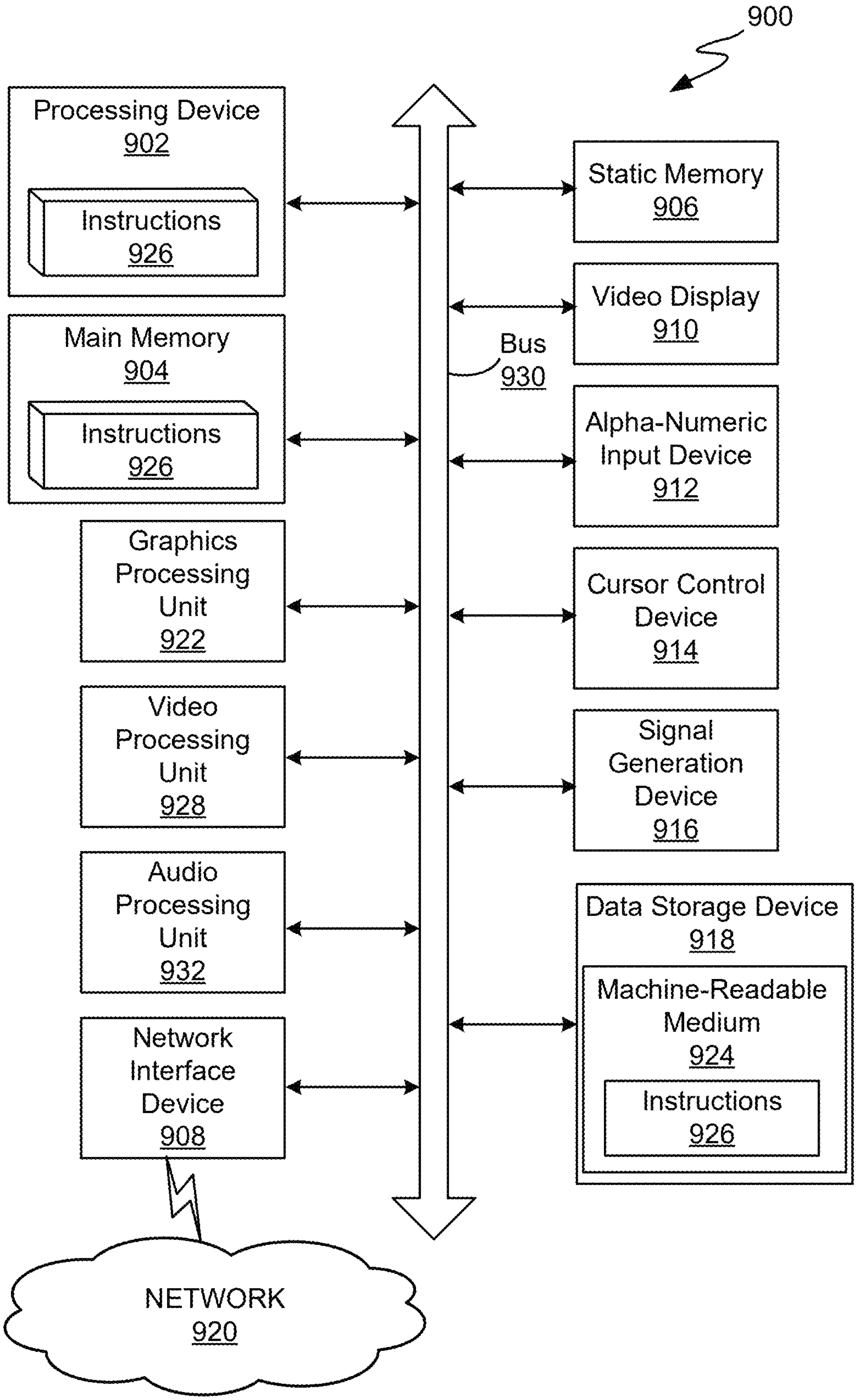
FIG. 9 is a block diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

What is claimed:

1. A clock multiplexing circuit comprising at least a first clock driver receiving a first clock signal and a second clock driver receiving a second clock signal, each of the first and second clock drivers comprising:

a first tri-stateable inverter adapted to invert a first signal in response to an assertion of an enabling signal, and further adapted to be in a high-impedance state in response to a deassertion of the enabling signal;

a first circuit block adapted to couple an input of the first tri-stateable inverter to a ground terminal in response to the deassertion of the enabling signal;

a second tri-stateable inverter adapted to invert a second signal in response to the assertion of the enabling signal, and further adapted to be in the high-impedance state in response to the deassertion of the enabling signal, wherein an output of the first tri-stateable inverter and an output of the second tri-stateable inverter are coupled to a first node, and wherein each of the first and second signals is representative of a respective one of the first and second clock signals; and a second circuit block adapted to couple an input of the second tri-stateable inverter to a supply voltage in response to the deassertion of the enabling signal.

2. The clock multiplexing circuit of claim 1, wherein each of the first and second tri-stateable inverters comprises:

a first PMOS transistor having a source terminal coupled to the supply voltage and a gate terminal receiving an inverse of the enabling signal;

a second PMOS transistor having a source terminal coupled to a drain terminal of the first PMOS transistor, and a gate terminal receiving a respective one of the first and second signals;

a first NMOS transistor having a source terminal coupled to the ground terminal and a gate terminal receiving the enabling signal; and a second NMOS transistor having a source terminal coupled to a drain terminal of the first NMOS transistor, a gate terminal coupled to the gate terminal of the second PMOS transistor, and a drain terminal coupled to a drain terminal of the second PMOS transistor.

3. The clock multiplexing circuit of claim 2, wherein each of the first and second clock drivers further comprises:

a third tri-stateable inverter adapted to invert the respective one of the first and second clock signals to generate the first signal in response to the assertion of the enabling signal, and further adapted to be in the high-impedance state in response to the deassertion of the enabling signal; and a fourth tri-stateable inverter adapted to invert the respective one of the first and second clock signals to generate the second signal in response to the assertion of the enabling signal, and further adapted to be in the high-impedance state in response to the deassertion of the enabling signal.

4. The clock multiplexing circuit of claim 3, wherein each of the third and fourth tri-stateable inverters comprises:

a third PMOS transistor having a source terminal coupled to the supply voltage and a gate terminal receiving the inverse of the enabling signal;

a fourth PMOS transistor having a source terminal coupled to a drain terminal of the third PMOS transistor, and a gate terminal receiving the respective one of the first and second clock signals;

a third NMOS transistor having a source terminal coupled to the ground terminal and a gate terminal receiving the enabling signal; and a fourth NMOS transistor having a source terminal coupled to a drain terminal of the third NMOS transistor, a gate terminal coupled to the gate terminal of the fourth PMOS transistor, and a drain terminal coupled to a drain terminal of the fourth PMOS transistor.

5. The clock multiplexing circuit of claim 4, wherein the first circuit block is an NMOS transistor having a drain terminal receiving the first signal, a source terminal coupled to the ground terminal and a gate terminal receiving the inverse of the enabling signal.

6. The clock multiplexing circuit of claim 5, wherein the second circuit block is a PMOS transistor having a drain terminal receiving the second signal, a source terminal coupled to the supply voltage and a gate terminal receiving the enabling signal.

7. The clock multiplexing circuit of claim 6, wherein a ratio of a channel-width (W) to channel length (L) of the first PMOS transistor is greater than W/L of the second PMOS transistor, and wherein W/L of the first NMOS transistor is greater than W/L of the second NMOS transistor.

8. The clock multiplexing circuit of claim 7, wherein the clock multiplexing circuit delivers either the first clock signal or the second clock signal to the first node.

9. A method of multiplexing between a first clock signal and a second clock signal, the method comprising:

inverting a first signal in response to an assertion of an enabling signal by a first tri-stateable inverter;

placing the first tri-stateable inverter in a high-impedance state in response to a deassertion of the enabling signal;

inverting a second signal in response to the assertion of the enabling signal by a second tri-stateable inverter, wherein each of the first and second signals is representative of a respective one of the first and second clock signals;

placing the second tri-stateable inverter in the high-impedance state in response to the deassertion of the enabling signal;

coupling an output of the first tri-stateable inverter and the second tri-stateable inverter to a first node;

coupling an input of the first tri-stateable inverter to a ground terminal in response to the deassertion of the enabling signal; and coupling an input of the second tri-stateable inverter to a supply voltage in response to the deassertion of the enabling signal.

10. The method of claim 9, wherein each of the first and second tri-stateable inverters comprises:

a first PMOS transistor having a source terminal coupled to the supply voltage and a gate terminal receiving an inverse of the enabling signal;

a second PMOS transistor having a source terminal coupled to a drain terminal of the first PMOS transistor, and a gate terminal receiving a respective one of the first and second signals;

a first NMOS transistor having a source terminal coupled to the ground terminal and a gate terminal receiving the enabling signal; and a second NMOS transistor having a source terminal coupled to a drain terminal of the first NMOS transistor, a gate terminal coupled to the gate terminal of the second PMOS transistor, and a drain terminal coupled to a drain terminal of the second PMOS transistor.

11. The method of claim 10, further comprising:

inverting the respective one of the first and second clock signals by a third tri-stateable inverter to generate the first signal in response to the assertion of the enabling signal;

placing the third tri-stateable in the high-impedance state in response to the deassertion of the enabling signal;

inverting the respective one of the first and second clock signals by a fourth tri-stateable inverter to generate the second signal in response to the assertion of the enabling signal; and placing the fourth tri-stateable inverter in the high-impedance state in response to the deassertion of the enabling signal.

12. The method of claim 11, wherein each of the third and fourth tri-stateable inverters comprises:

a third PMOS transistor having a source terminal coupled to the supply voltage and a gate terminal receiving the inverse of the enabling signal;

a fourth PMOS transistor having a source terminal coupled to a drain terminal of the third PMOS transistor, and a gate terminal receiving the respective one of the first and second clock signals;

a third NMOS transistor having a source terminal coupled to the ground terminal and a gate terminal receiving the enabling signal; and a fourth NMOS transistor having a source terminal coupled to a drain terminal of the third NMOS transistor, a gate terminal coupled to the gate terminal of the fourth PMOS transistor, and a drain terminal coupled to a drain terminal of the fourth PMOS transistor.

13. The method of claim 12, further comprising:

coupling an input of the first tri-stateable inverter to a ground terminal by an NMOS transistor.

14. The method of claim 13, further comprising:

coupling an input of the second tri-stateable inverter to a supply voltage by a PMOS transistor.

15. The method of claim 14, wherein a ratio of a channel-width (W) to channel length (L) of the first PMOS transistor is greater than W/L of the second PMOS transistor, and wherein W/L of the first NMOS transistor is greater than W/L of the second NMOS transistor.

16. The method of claim 15, further comprising:

delivering either the first clock signal or the second clock signal to the first node.

17. A non-transitory computer readable medium comprising stored instructions, which when executed by a processor, cause the processor to generate data representative of a clock multiplexing circuit comprising at least a first clock driver receiving a first clock signal and a second clock driver receiving a second clock signal, each of the first and second clock drivers further comprising:

a first tri-stateable inverter adapted to invert a first signal in response to an assertion of an enabling signal, and further adapted to be in a high-impedance state in response to a deassertion of the enabling signal;

a first circuit block adapted to couple an input of the first tri-stateable inverter to a ground terminal in response to the deassertion of the enabling signal;

a second tri-stateable inverter adapted to invert a second signal in response to the assertion of the enabling signal, and further adapted to be in the high-impedance state in response to the deassertion of the enabling signal, wherein an output of the first tri-stateable inverter and an output of the second tri-stateable inverter are coupled to a first node, and wherein each of the first and second signals is representative of a respective one of the first and second clock signals; and a second circuit block adapted to couple an input of the second tri-stateable inverter to a supply voltage in response to the deassertion of the enabling signal.

18. The non-transitory computer readable medium of claim 17, wherein each of the first and second tri-stateable inverters comprises:

a first PMOS transistor having a source terminal coupled to the supply voltage and a gate terminal receiving an inverse of the enabling signal;

a second PMOS transistor having a source terminal coupled to a drain terminal of the first PMOS transistor, and a gate terminal receiving the first signal;

a first NMOS transistor having a source terminal coupled to the ground terminal and a gate terminal receiving the enabling signal; and a second NMOS transistor having a source terminal coupled to a drain terminal of the first NMOS transistor, a gate terminal receiving the first signal, and a drain terminal coupled to a drain terminal of the second PMOS transistor.

19. The non-transitory computer readable medium of claim 17, wherein each of the first and second clock drivers further comprise:

a third tri-stateable inverter adapted to invert the respective one of the first and second clock signals to generate the first signal in response to the assertion of the enabling signal, and further adapted to be in the high-impedance state in response to the deassertion of the enabling signal; and a fourth tri-stateable inverter adapted to invert the respective one of the first and second clock signals to generate the second signal in response to the assertion of the enabling signal, and further adapted to be in the high-impedance state in response to the deassertion of the enabling signal.

20. The non-transitory computer readable medium of claim 19, wherein each of the third and fourth tri-stateable inverters comprises:

a third PMOS transistor having a source terminal coupled to the supply voltage and a gate terminal receiving the inverse of the enabling signal;

a fourth PMOS transistor having a source terminal coupled to a drain terminal of the third PMOS transistor, and a gate terminal receiving the respective one of the first and second clock signals;

a third NMOS transistor having a source terminal coupled to the ground terminal and a gate terminal receiving the enabling signal; and a fourth NMOS transistor having a source terminal coupled to a drain terminal of the third NMOS transistor, a gate terminal coupled to the gate terminal of the fourth PMOS transistor, and a drain terminal coupled to a drain terminal of the fourth PMOS transistor.

* * * * *